US006653190B1

(12) United States Patent
Yang et al.

(10) Patent No.: US 6,653,190 B1
(45) Date of Patent: *Nov. 25, 2003

(54) FLASH MEMORY WITH CONTROLLED WORDLINE WIDTH

(75) Inventors: Jean Y. Yang, Sunnyvale, CA (US); Kouros Ghandehari, Santa Clara, CA (US); Tazrien Kamal, San Jose, CA (US); Minh Van Ngo, Fremont, CA (US); Mark T. Ramsbey, Sunnyvale, CA (US); Dawn M. Hopper, San Jose, CA (US); Angela T. Hui, Fremont, CA (US); Scott A. Bell, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/023,436

(22) Filed: Dec. 15, 2001

(51) Int. Cl.⁷ ............................................. H01L 21/336
(52) U.S. Cl. ...................... 438/258; 438/591; 438/636; 438/761
(58) Field of Search .................. 257/310, 410, 257/411; 438/197, 211, 216, 240, 258, 261, 266, 267, 287, 396, 591, 636, 689, 705, 706, 712, 735, 738, 761, 763, 785

(56) References Cited

U.S. PATENT DOCUMENTS

| | | | | |
|---|---|---|---|---|
| 6,348,406 B1 | * | 2/2002 | Subramanian et al. | 438/636 |
| 6,365,509 B1 | * | 4/2002 | Subramanian et al. | 438/636 |
| 6,479,348 B1 | * | 11/2002 | Kamal et al. | 438/258 |
| 6,485,988 B2 | * | 11/2002 | Ma et al. | 438/3 |
| 6,492,222 B1 | * | 12/2002 | Xing | 438/240 |

* cited by examiner

Primary Examiner—Kamand Cuneo
Assistant Examiner—Asok Kumar Sarkar
(74) Attorney, Agent, or Firm—Mikio Ishimaru

(57) ABSTRACT

A method of manufacturing for a MirrorBit® Flash memory includes depositing a charge-trapping material over a semiconductor substrate and implanting first and second bitlines in the semiconductor substrate. A wordline material is deposited over the charge-trapping dielectric material and a hard mask material deposited thereon. An anti-reflective coating (ARC) material is deposited on the hard mask material and a photoresist material is deposited on the ARC followed by processing the photoresist material and the ARC material to form a photomask of a patterned photoresist and a patterned ARC. The hard mask material is processed using the photomask to form a hard mask. The patterned photoresist is removed and then the patterned ARC without damaging the hard mask or the wordline material. The wordline material is processed using the hard mask to form a wordline and the hard mask is removed without damaging the wordline or the charge-trapping material.

20 Claims, 5 Drawing Sheets

FLASH MEMORY WITH CONTROLLED WORDLINE WIDTH

BACKGROUND OF THE INVENTION

1. Technical Field

The present invention relates generally to semiconductor technology and more specifically to controlling wordline width in MirrorBit® Flash memory.

2. Background Art

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lack erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge.

Thus, both speed and reliability are sacrificed in order to improve memory cell density.

An even newer technology allowing multiple bits to be stored in a single cell is known as "MirrorBit®" Flash memory has been developed. In this technology, a memory cell is essentially split into two identical (mirrored) parts, each of which is formulated for storing one of two independent bits. Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

A major problem with the MirrorBit architecture has been discovered as the memory cells are scaled down in size or shrunk and the electrical resistance of the cells increases faster than the scale down in size. The relatively higher electrical resistance in smaller devices results in higher power requirements, and subsequent heat generation with reduced life expectancy, for the memory cell.

A solution to this problem has been long sought but has long eluded those skilled in the art.

DISCLOSURE OF THE INVENTION

The present invention provides a manufacturing method for semiconductor devices, which includes providing a semiconductor substrate and depositing a charge-trapping dielectric layer. First and second bitlines are implanted and a wordline material is deposited over the charge-trapping dielectric material and a hard mask material deposited thereon. An anti-reflective coating (ARC) material is deposited on the hard mask material and a photoresist material is deposited on the ARC followed by processing the photoresist material and the ARC material to form a photomask of a patterned photoresist and a patterned ARC. The hard mask material is processed using the photomask to form a hard mask. The patterned photoresist is removed and then the patterned ARC without damaging the hard mask or the wordline material. The wordline material is processed using the hard mask to form a wordline and the hard mask is removed without damaging the wordline or the charge-trapping material. With the wordlines of the design widths, the higher electrical resistance in smaller devices is reduced resulting in lower power requirements, and subsequent reduced heat generation with longer life expectancy, for the memory cell. Further, with control over the wordlines widths, the memory cells can be placed closer together resulting in further size reductions for the entire circuitry.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
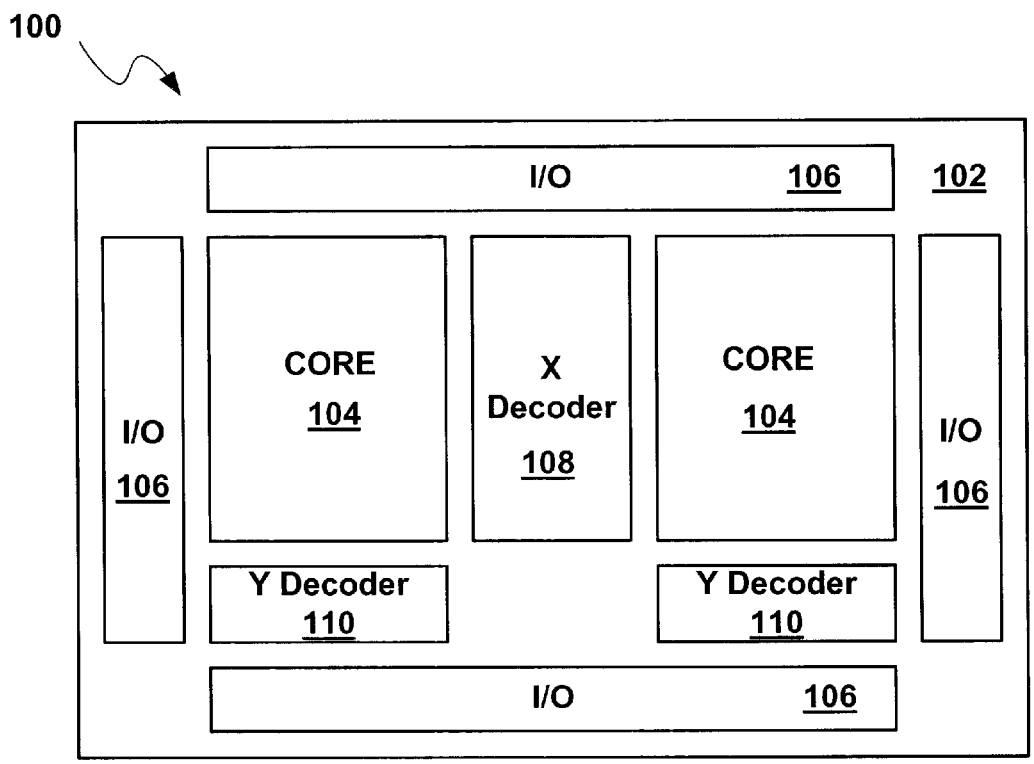
FIG. 1 (PRIOR ART) is a plan view of a conventional MirrorBit Flash EEPROM.

Referring now to FIG. 1 (PRIOR ART), therein is shown a plan view of a MirrorBit® Flash EEPROM 100, which commonly includes a semiconductor substrate 102 in which one or more high-density core regions and one or more low-density peripheral portions are formed. High-density core regions typically include one or more M×N array cores 104 of individually addressable, substantially identical MirrorBit Flash memory cells. Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is defined as a plane parallel to the conventional plane or surface the semiconductor substrate 102 regardless of its orientation. The term "vertical" refers to a direction perpendicular to the horizontal as just defined. Terms, such as "on", "above", "below", "higher", "lower", "over", "under", "thick", "side" and "beside", are defined with respect to these horizontal and vertical planes. The term "processed" as used herein is defined to include one or more of the following: depositing or growing semiconductor materials, masking, patterning, photolithography, etching, implanting, removal, and/or stripping.

Figure 2:
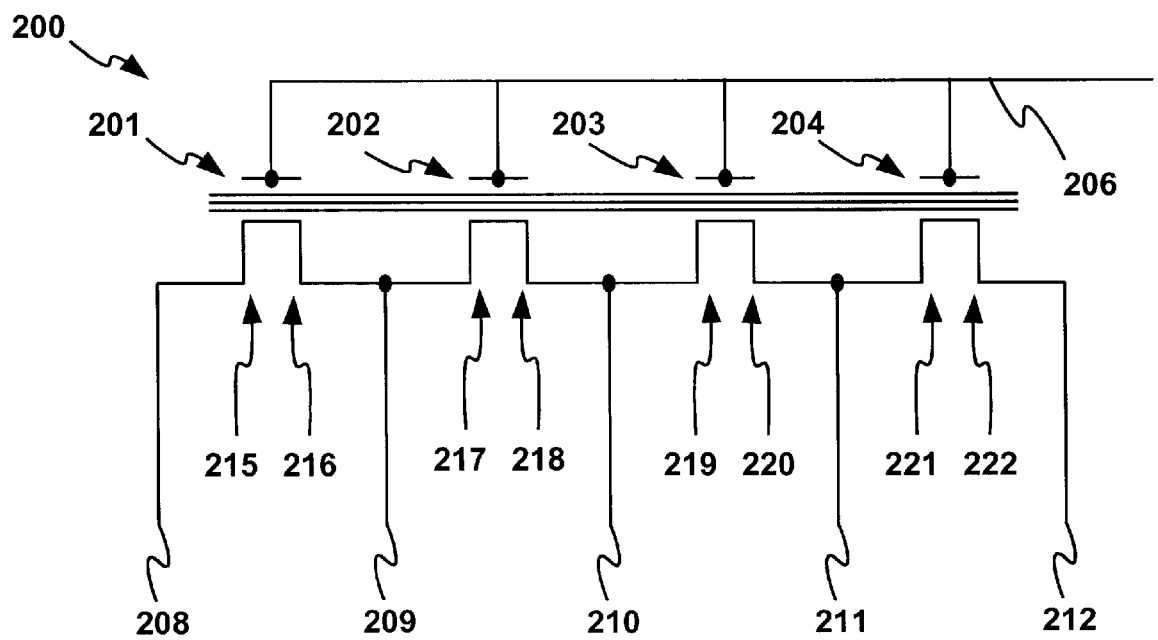
FIG. 2 (PRIOR ART) is a circuit schematic of a portion of one of the M×N array cores of FIG. 1 (PRIOR ART)

Referring now to FIG. 2 (PRIOR ART), therein is shown a circuit schematic of a portion of one of the M×N array cores 104 of FIG. 1 (PRIOR ART). The circuit schematic shows a line of memory cells 200, which includes memory cells 201 through 204 and which together can form an 8-bit word. Each of the memory cells 201 through 204 is connected to a wordline 206, which acts as a control gate. Each of the memory cells 201 through 204 has two associated bitlines with most of the memory cells having a common bitline. The memory cell 201 has associated bitlines 208 and 209; the memory cell 202 has associated bitlines 209 and 210; the memory cell 203 has associated bitlines 210 and 211; and the memory cell 204 has associated bitlines 211 and 212.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. Although adjacent memory cells share common bitlines, the adjacent memory cells do not interfere with each other because the memory cells are programmed one at a time and only one memory cell is active at a time while programming.

Figure 3:
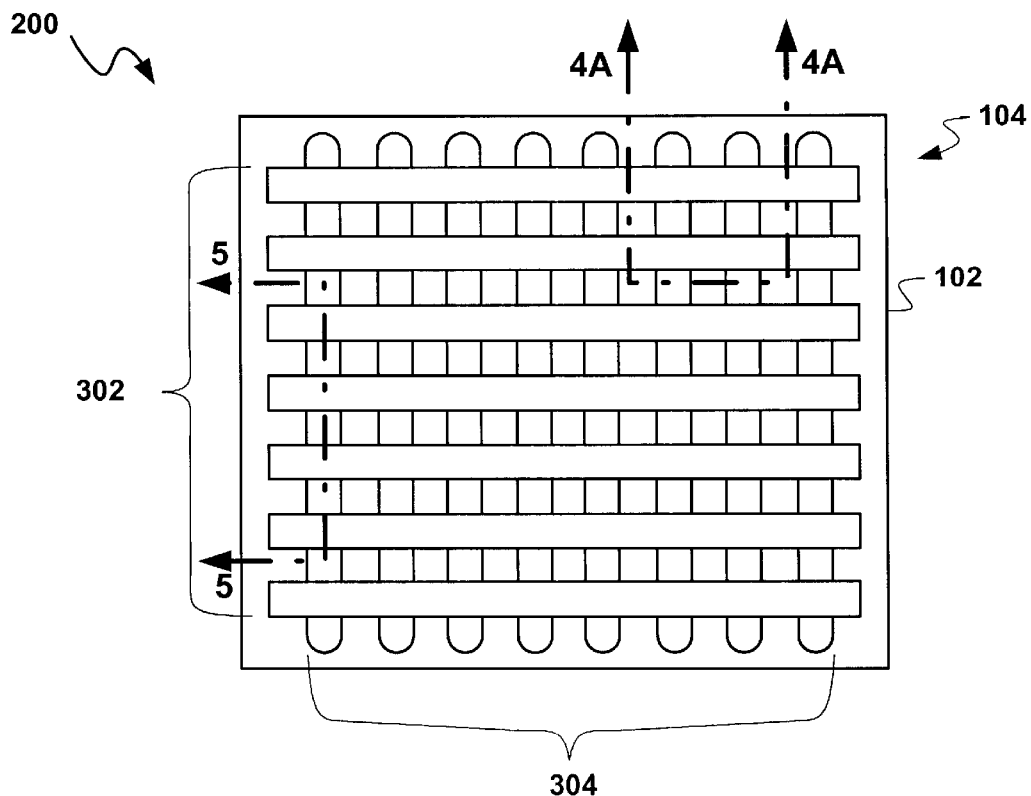
FIG. 3 (PRIOR ART) is a plan view of a portion of one of the M×N array cores 104 of FIG. 1 (PRIOR ART)

Referring now to FIG. 3 (PRIOR ART), therein is shown a plan view of a portion of one of the M×N array cores 104 of FIG. 1 (PRIOR ART). The semiconductor substrate 102 has a plurality of implanted bitlines 304 extending in parallel with a plurality of formed wordlines 302 extending in parallel and at right angles to the plurality of implanted bitlines 304. The wordlines 302 and bitlines 304 have contacts and interconnections (not shown) to the programming circuitry represented in part by x-decoders 108 and y-decoders 110 of FIG. 1 (PRIOR ART).

Figure 4A:
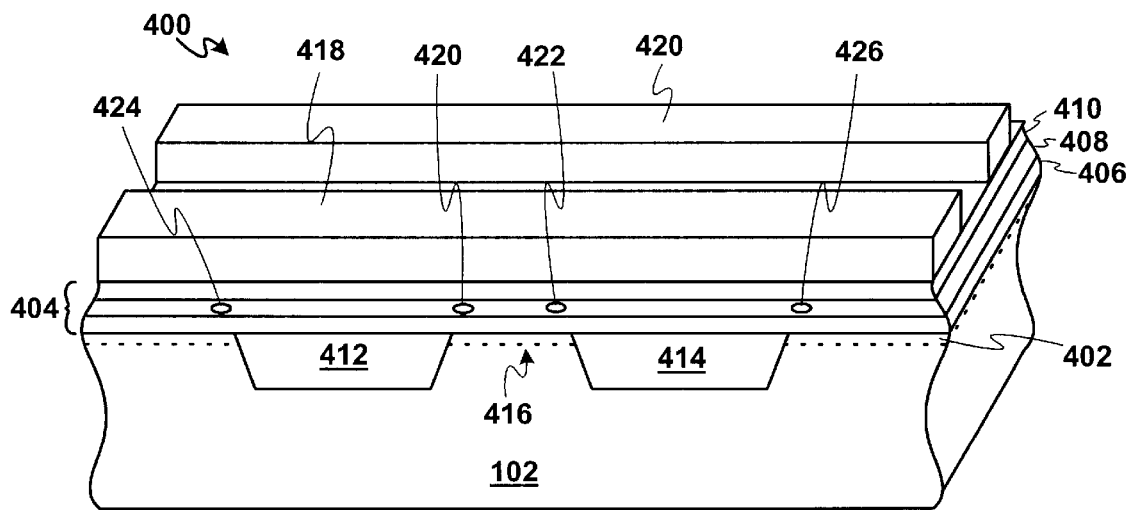
FIG. 4A (PRIOR ART) is a cross-sectional isometric view of a typical MirrorBit Flash memory cell along the line 4A—4A of FIG. 3 (PRIOR ART)

Referring now to FIG. 4A (PRIOR ART), therein is shown a cross-sectional isometric view of a typical MirrorBit Flash memory cell along the line 4—4 of FIG. 3 (PRIOR ART), such as a memory cell 400. The semiconductor substrate 102 is a p-doped silicon substrate with a threshold adjustment implant 402 of a p-type material, such as boron. The threshold adjustment implant 402 provides a region that is more heavily doped than the semiconductor substrate 102 itself and assists in the control of the threshold voltage of the memory cell 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are of an oxide dielectric such as silicon dioxide ($SiO_2$) and the charge-trapping layer 408 is of a nitride dielectric such as silicon nitride ($Si_xN_y$). The oxide-nitride-oxide configuration is frequently referred to as a matter of convenience as an "ONO layer".

The bitlines 304 of FIG. 3 (PRIOR ART) are implanted under the charge-trapping dielectric layer 404 in the semiconductor substrate 102 as typified by first and second conductive bitlines 412 and 414. They are typically of an implanted n-type material, such as arsenic, and can include an oxide portion (not shown) in some embodiments. The first and second conductive bitlines 412 and 414 are spaced apart and define a volume between them with the threshold adjustment implant 402, which is a channel 416.

A material, such as polysilicon, is deposited over the charge-trapping dielectric layer 404, patterned, etched, and stripped resulting in a wordline 418. The wordline 418 is one of the wordlines 302 in FIG. 3 (PRIOR ART).

It is understood that the implementation of each step in manufacturing has associated processing steps.

The locations 420 through 422 indicate where bits can be stored in the memory cell 400 and locations 424 and 426 are adjacent locations, which are independent of the memory cell 400.

As explained briefly earlier, major problem with the MirrorBit architecture has been discovered as the memory cells are scaled down in size or shrunk and the resistance increases faster than the decreased in the size of the memory cells.

Figure 4B:
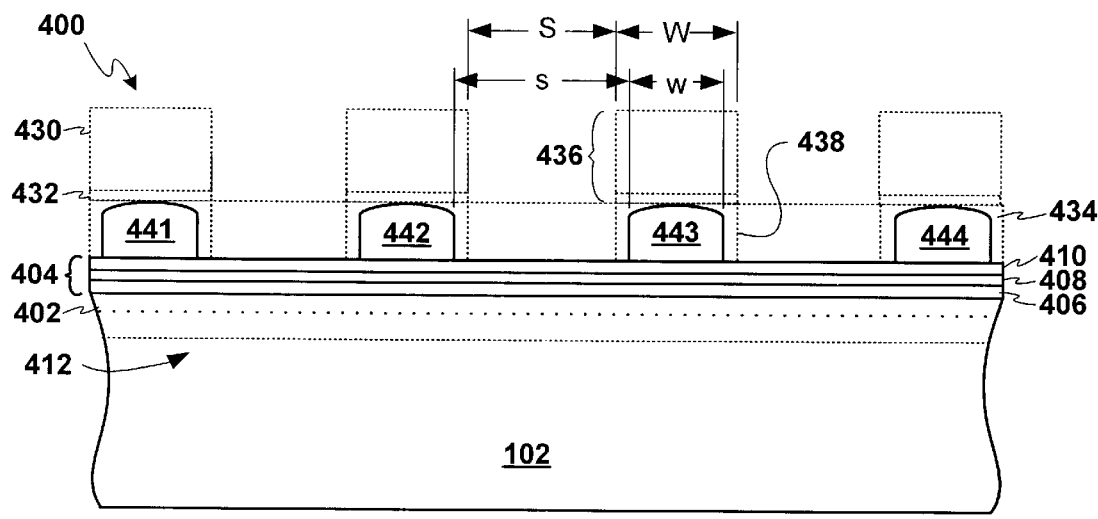
FIG. 4B (PRIOR ART) is a cross-sectional view of the typical MirrorBit Flash memory cell during one stage of manufacturing.

Referring now to FIG. 4B (PRIOR ART), therein is shown a cross-sectional view of the memory cell 400 during one stage of manufacturing. The same numbers in FIG. 4B (PRIOR ART) refer to the same elements as in FIG. 4A (PRIOR ART).

A photoresist material 430 is deposited on an optional anti-reflective coating (ARC) material 432, which is on a wordline material 434. The photoresist material 430 is processed first and the ARC material 432 is processed second using the processed photoresist to be a combination photomask 436 for the wordline material 434. The optional ARC material 432 is used to absorb light passing through the photoresist material 430 by reducing standing waves and reflection back into the photoresist material 430.

The processing of the wordline material 434 is intended to form wordlines having a wordline outline 438, a width "W", and a space between wordlines of "S".

In the past, after the photoresist material 430 and the ARC material 432 are removed, the wordlines were found to have shrunk to form wordlines 441 through 444, which have typical widths "w" and increased typical spacing "s". The term "typical" is used because the "w" and "s" varied randomly.

This resulted in the electrical resistance of the memory cells increasing faster than the scale down in size because the wordlines were narrower in some places than designed. The relatively higher electrical resistance in smaller devices resulted in higher power requirements, and subsequent heat generation with reduced life expectancy, for the memory cell.

Further, the randomness of "w" and "s", and limitations on how small the etch openings in the photomask could be made, made it difficult to have properly spaced and sized wordlines so as to be able to minimize the size of the Flash device. This is because a minimally sized space might have a random "s" which was too small or non-existent.

After much investigation, it was discovered that there were a number of different contributing factors to the problem. It was discovered that during the processing of the ARC material 432, the sides of the patterned photoresist and the ARC material as it was patterned would erode slightly. Thus, the combination photomask 436 would start off with the wordlines slightly narrower than the original photomask with the wordlines at "W". The etching through the relatively thick wordline material would cause further erosion of the combination photomask 436 in a somewhat random manner. In addition, during the removal of the ARC material, which requires a different removal process from the photoresist, there would be some additional reduction in the wordline width.

Essentially, at the beginning of etching, the wordline would have the width "W". Over time, the edges of the combination photomask 436 would start to erode until the wordlines 441 through 444 were formed having the typical widths "w".

For example, this would be true using an organic photoresist material, an organic ARC material, and a polysilicon wordline material.

Figure 5:
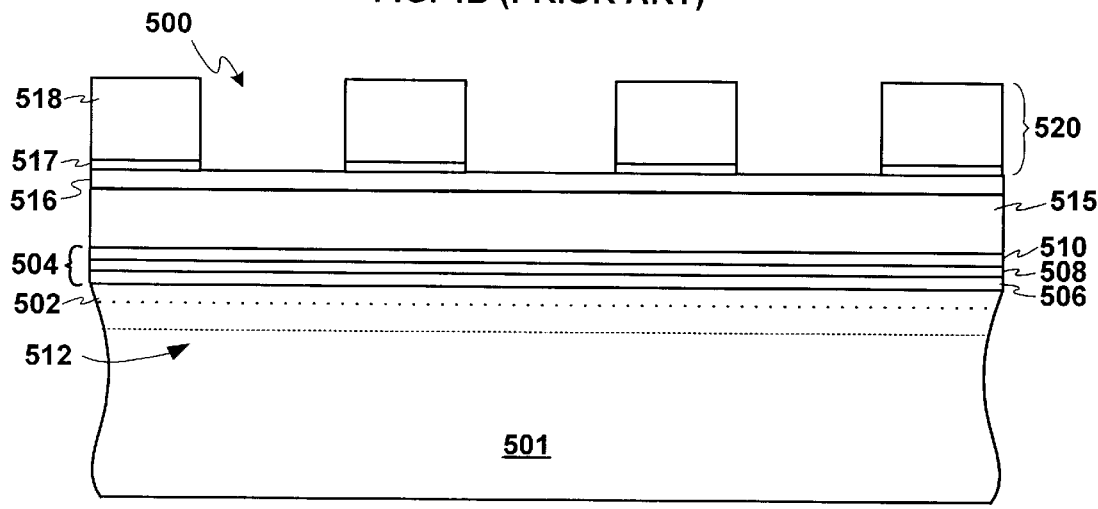
FIG. 5 is a cross-sectional view of a partially processed memory cell similar to a cross-sectional view along line 5—5 in FIG. 3 (PRIOR ART)

Referring now to FIG. 5, therein is shown a cross-sectional view of a partially processed memory cell 500 similar to a cross-sectional view along line 5—5 in FIG. 3 (PRIOR ART). A p-type silicon substrate 501 has been implanted or processed with a p-type threshold adjustment implant 502.

A charge-trapping dielectric layer 504 is deposited over the silicon substrate 501. The charge-trapping dielectric layer 504 generally can be composed of three separate layers: a first insulating layer 506, a charge-trapping layer 508, and a second insulating layer 510. The first and second insulating layers 506 and 510 may be of an oxide dielectric such as silicon dioxide ($SiO_2$) and the charge-trapping layer 508 may be of a nitride dielectric such as silicon nitride ($Si_xN_y$) to form an ONO layer. It will be noted that the present invention is not limited to specific dielectric or charge-trapping materials.

The bitlines, as typified by a first n-type bitline 512, are implanted under the charge-trapping dielectric layer 504 in the silicon substrate 501 and a wordline material 515, such as polysilicon, has been deposited over the charge-trapping dielectric layer 504. Again, it will be noted that the present invention is not limited to specific bitline or gate materials. For example, NPN structures are shown but the structures can also be PNP.

A hard mask material 516 has been deposited over the wordline material 515 and has not been processed. An ARC material 517 has been deposited over the hard mask material 516 and a photoresist material 518 has been deposited over the ARC material 517. Further, both the photoresist material 518 and the ARC material 517 have been processed (i.e., the materials have been deposited, masked, patterned, exposed, and etched) into a combination photomask 520 for processing the hard mask material 516.

Figure 6:
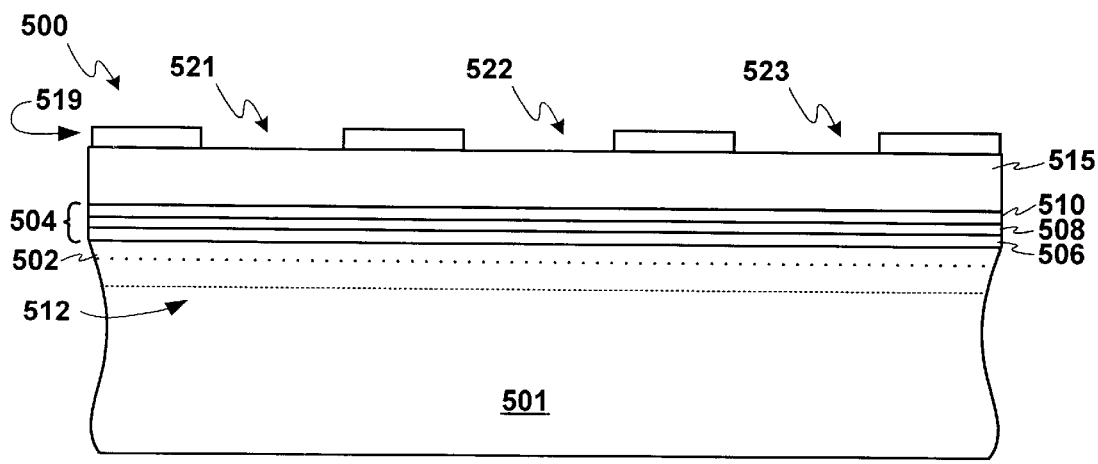
FIG. 6 is the structure of FIG. 5 after formation of a hard mask and removal of the photoresist and the ARC layer.

Referring now to FIG. 6, therein is shown the structure of FIG. 5 after formation of a hard mask 519 and removal of the combination photomask 520. The hard mask 519 has spaces 521 through 523 and is used alone to create the structure of FIG. 7.

Figure 7:
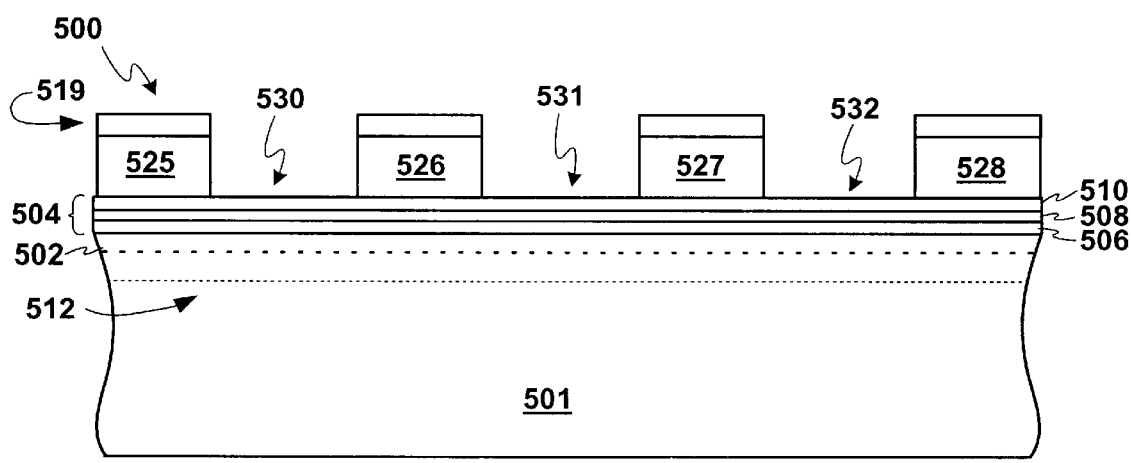
FIG. 7 is the structure of FIG. 6 after processing using the hard mask to form wordlines.

Referring now to FIG. 7, therein is shown the structure of FIG. 6 after processing using the hard mask 519 to form wordlines 525 through 528. Since the hard mask 519 is thin, the wordlines 525 through 528 are the same size as the originally patterned photomask 520 without being narrowed. Thus, the wordline width and spacing can be controlled to be the proper size as designed.

Figure 8:
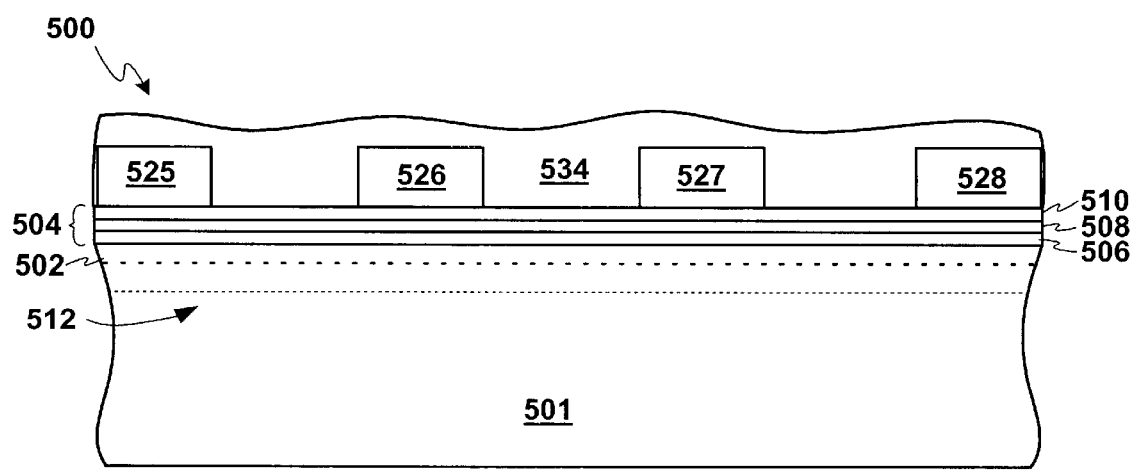
FIG. 8 is the structure of FIG. 7 after deposition of a spacer material.

Referring now to FIG. 8 therein is shown the structure of FIG. 7 after removal of the hard mask 519. An inorganic spacer material 534 has been deposited because it is required for the peripheral portions of the Flash EEPROM 100 of FIG. 1.

Figure 9:
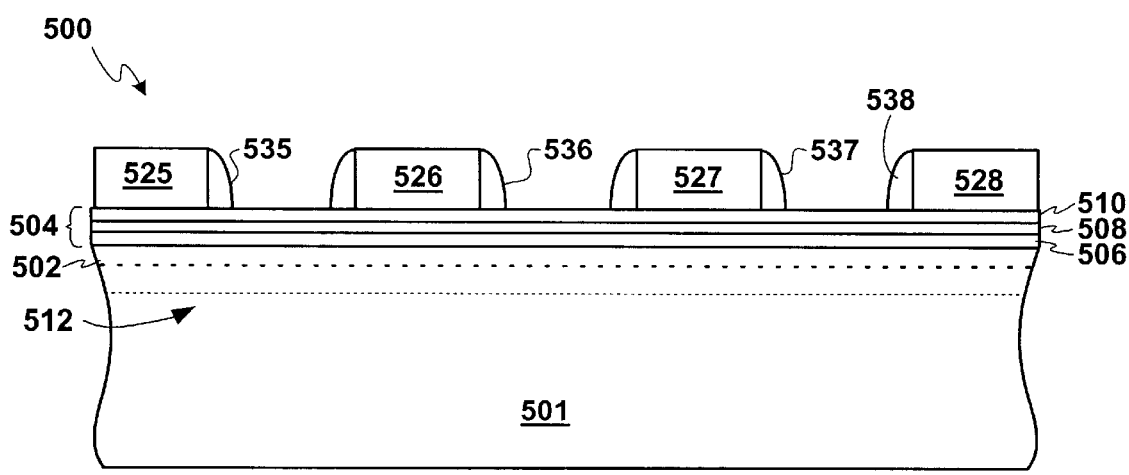
FIG. 9 is the structure of FIG. 8 with saliciding.

Referring now to FIG. 9, therein is shown the structure of FIG. 8 after etching of spacer material 534 to form spacers 535 through 538 around the respective wordlines 525 through 528. If the spacers 535 through 538 are not formed, an additional masking step of the entire core is required or additional processing steps to provide access to the bitlines.

Figure 10:
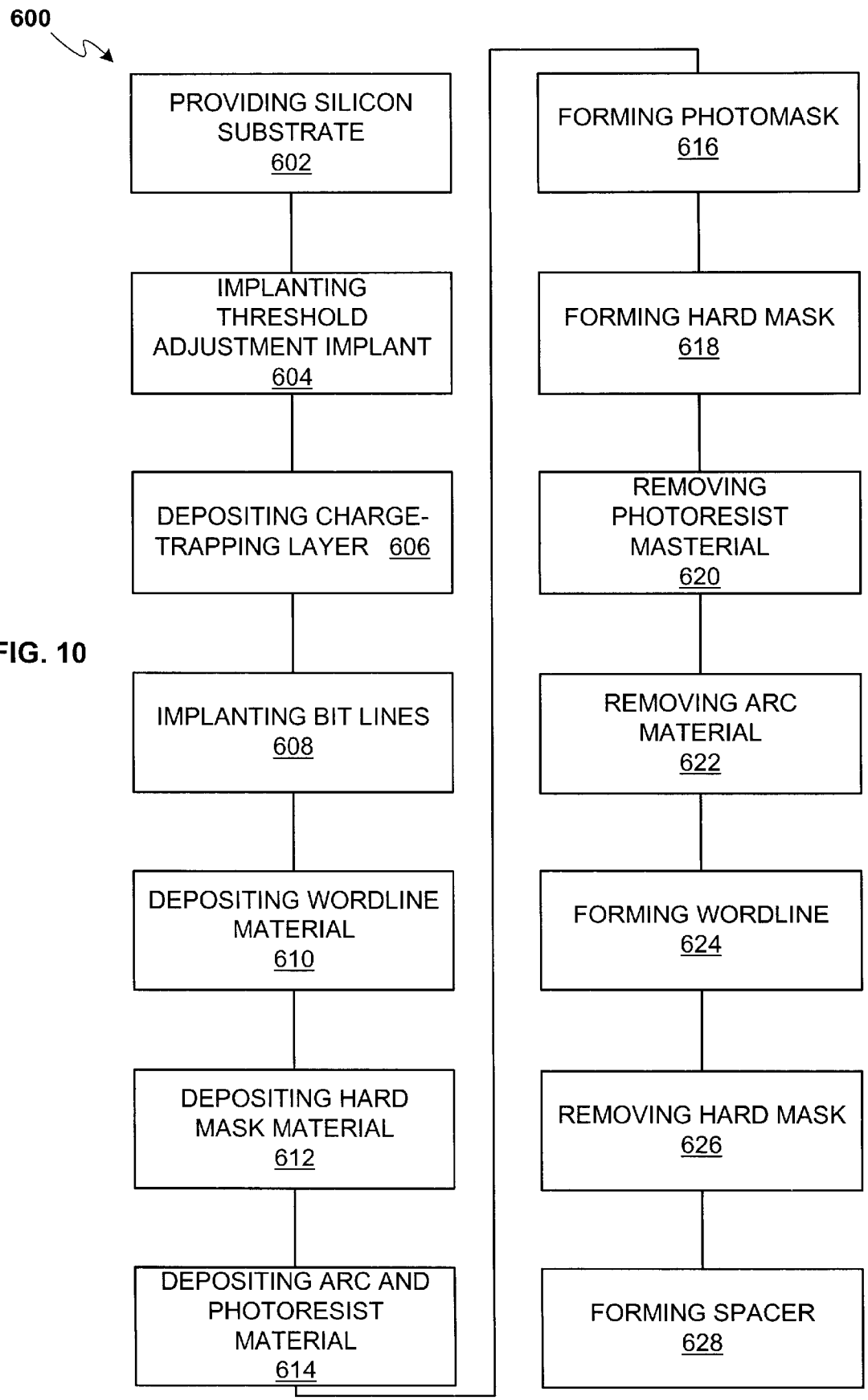
FIG. 10 is shown a simplified process chart of the present invention.

Referring now to FIG. 10, therein is shown a simplified process chart 600 of the present invention which includes: providing a semiconductor substrate 602; implanting a threshold adjustment implant 604; depositing a charge-trapping dielectric material 606; implanting bitlines 608; depositing wordline material 610; depositing hard mask material 612; depositing ARC and photoresist material 614; forming a photomask 616; forming a hard is mask 618; removing photoresist material 620; removing ARC material 622; forming wordline 624; removing hard mask 626, and forming spacer 628. Various alternative sequences, additions, and deletions to this process chart would be obvious to those skilled in the art from a detailed reading of the present disclosure.

As a result of developing the above process, it was discovered that certain physical characteristics were necessary among the charge-trapping dielectric material, the wordline material, the hard mask material, and the ARC material or the photoresist material.

The hard mask material 516 needs to be formulated to be a material that can be removed from the wordline material 515 without the removal process damaging any exposed portion (undamaged or previously damaged) of the charge-trapping dielectric layer 504 at the same time. The difficulty of removal is a function of selectivity and it has been discovered that there must be a selectivity of at least 5:1 from the hard mask material 516 to the charge-trapping dielectric layer 504 and also from the wordline material 515 to the hard mask material 516.

For example, where the charge-trapping dielectric layer 504 is an ONO layer and it is expected that the top oxide layer will be already slightly damaged, the concern will be the possibility of damaging the middle nitride layer. This means that a high selectivity of the hard mask material 516 to the middle nitride layer is desired of the order of 20:1. In addition, if the wordline material 515 is of polysilicon, the hard mask material 516 should be of a material having a lower silicon content than the polysilicon, such as silicon oxide. The removal process will avoid damaging the middle nitride layer but will allow easy removal of the hard mask material 516 from the polysilicon wordline material. For different combinations of materials in the charge-trapping dielectric layer 504 and processing modifications, other materials could be used, for example a nitride such as silicon nitride or a silicon oxynitride.

The ARC material 517 needs to be formulated to be a material that can be easily removed from the hard mask material 516 without the removal process damaging either the hard mask material 516 or the exposed portion of the wordline material 515. Unexpectedly, it has been found that removal damage to the wordline material 515 can cause accelerated etching under the damaged areas, which may result in damage to the charge-trapping dielectric layer 504 by the wordline etching process. It has been discovered that there must be a selectivity of at least 2:1 from the ARC material 517 to the hard mask material 516 and also a selectivity of at least 2:1 from the ARC material 517 to the wordline material 515.

For example, where the hard mask material 516 is an oxide and the wordline material 515 is polysilicon, the ARC material 517 can be an organic ARC material, such as an organic polymer material, or an inorganic material, such as silicon nitride, nitrogen rich silicon nitride or nitrogen rich silicon oxynitride.

The photoresist will generally be an organic polymer.

Various implementations of the method may be used in different electronic devices and especially the dual bit memory cell architecture may be achieved according to one or more aspects of the present invention. In particular, the invention is applicable to memory devices wherein both bits in a dual bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising.

depositing a charge-trapping material over a semiconductor substrate;

forming first and second bitlines in the semiconductor substrate;

depositing a wordline material over the charge-trapping material;

depositing a hard mask material over the wordline material;

depositing an anti-reflective coating material over the hard mask material;

depositing a photoresist material over the anti-reflective coating material;

processing the photoresist material and the anti-reflective coating material to form a photomask of a patterned photoresist material and a patterned anti-reflective coating material;

processing the hard mask material using the photomask to form a hard mask:

removing the patterned photoresist;

removing the patterned anti-reflective coating material without damaging at least one of the hard mask, the wordline material, and a combination thereof;

processing the wordline material using the hard mask to form a wordline; and removing the hard mask without damaging at least one of the wordline, the charge-trapping material, and a combination thereof.

2. The method of manufacturing an integrated circuit as claimed in claim 1 wherein removing the patterned anti-reflective coating material uses an anti-reflective coating material formulated to be more easily removable than the hard mask material.

3. The method of manufacturing an integrated circuit as claimed in claim 1 wherein removing the patterned anti-reflective coating material uses an anti-reflective coating material formulated to be more easily removable than the wordline material.

4. The method of manufacturing an integrated circuit as claimed in claim 1 wherein removing the hard mask uses a hard mask material formulated to be more easily removable than the charge-trapping material.

5. The method of manufacturing an integrated circuit as claimed in claim 1 wherein processing the wordline uses a wordline material formulated to be more easily removable than the bard mask material.

6. The method of manufacturing an integrated circuit as claimed in claim 1 wherein depositing the hard mask material deposits an inorganic material.

7. The method of manufacturing an integrated circuit as claimed in claim 1 wherein the charge-trapping material is composed of:

a first dielectric material;

a charge-trapping material over the first dielectric material; and a second dielectric material over the charge-trapping material.

8. A method of manufacturing an integrated circuit comprising:

providing a semiconductor substrate;

depositing a charge-trapping dielectric layer over the silicon substrate;

implanting first and second bitlines in the silicon substrate;

depositing a polysilicon wordline material over the charge-trapping dielectric material;

depositing a bard mask material over the polysilicon wordline material;

depositing an anti-reflective coating material over the hard mask material;

depositing a photoresist material over the anti-reflective coating material;

processing the photoresist material;

processing the anti-reflective coating material to form a combination photomask of patterned photoresist material and patterned anti-reflective coating material;

processing the hard mask material using the combination photomask to form a hard mask;

removing the patterned photoresist over the patterned anti-reflective coating material without damaging at least one of the anti-reflective coating material, the hard mask material, and a combination thereof;

removing the patterned anti-reflective coating material without damaging at least one of the hard mask, the wordline material, and a combination thereof;

processing the polysilicon wordline material using the hard mask to form a polysilicon wordline; and removing the hard mask without damaging at least one of the wordline, the charge-trapping material, and a combination thereof.

9. The method of manufacturing an integrated circuit as claimed in claim 8 wherein removing the patterned anti-reflective coating material uses a removal process having at least a 2:1 selectivity of the anti-reflective coating material to the hard mask material.

10. The method of manufacturing an integrated circuit as claimed in claim 8 wherein removing the patterned anti-reflective coating material uses a removal process having at least a 2:1 selectivity of the anti-reflective coating material to the wordline material.

11. The method of manufacturing an integrated circuit as claimed in claim 8 wherein removing the hard mask uses a removal process having at least a 5:1 selectivity of the hard mask material to the charge-trapping dielectric material.

12. The method of manufacturing an integrated circuit as claimed in claim 8 wherein processing the polysilicon wordline material uses a removal process having at least a 5:1 selectivity of the polysilicon wordline material to the hard mask material.

13. The method of manufacturing an integrated circuit as claimed in claim 8 wherein depositing the anti-reflective coating material deposits on the hard mask material at least one of an organic polymer material and a nitrogen rich silicon material.

14. The method of manufacturing an integrated circuit as claimed in claim 8 wherein depositing the anti-reflective coating material deposits on the hard mask material at least one of an organic polymer material, silicon nitride, nitrogen rich silicon nitride, and a nitrogen rich silicon oxynitride.

15. The method of manufacturing an integrated circuit as claimed in claim 8 wherein depositing the hard mask material deposits a material having less silicon than the polysilicon wordline material.

16. The method of manufacturing an integrated circuit as claimed in claim 8 wherein depositing the photoresist material deposits an organic polymer.

17. The method of manufacturing an integrated circuit as claimed in claim 8 wherein:

depositing the charge-trapping material deposits a charge-trapping material between two insulating materials;

depositing the hard mask material deposits a material different from the charge-trapping material; and depositing the anti-reflective coating material deposits a material different from the hard mask material.

18. The method of manufacturing an integrated circuit as claimed in claim 8 including depositing an inorganic spacer material and forming inorganic spacers around the polysilicon wordline.

19. The method of manufacturing an integrated circuit as claimed in claim 8 including implanting a p-type threshold adjustment implant into the p-type silicon substrate.

20. The method of manufacturing an integrated circuit as claimed in claim 8 wherein the charge-trapping dielectric material is composed of:

a first oxide material;

a nitride material over the first oxide material; and a second oxide material over the nitride material.

* * * * *

UNITED STATES PATENT AND TRADEMARK OFFICE
CERTIFICATE OF CORRECTION

PATENT NO. : 6,653,190 B1  
DATED : November 25, 2003  
INVENTOR(S) : Yang et al.

It is certified that error appears in the above-identified patent and that said Letters Patent is hereby corrected as shown below:

Column 6,
Line 64, delete "is"

Column 9,
Line 11, delete "bard" and insert therefore -- hard --

Signed and Sealed this

Sixth Day of January, 2004

JAMES E. ROGAN
*Director of the United States Patent and Trademark Office*